(12) United States Patent
Moon

(10) Patent No.: US 6,927,175 B2
(45) Date of Patent: Aug. 9, 2005

(54) METHOD OF FABRICATING X-RAY DETECTING DEVICE

(75) Inventor: Kyo Ho Moon, Daegu-shi (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/025,905

(22) Filed: Dec. 26, 2001

(65) Prior Publication Data

US 2002/0084475 A1 Jul. 4, 2002

(30) Foreign Application Priority Data

Dec. 29, 2000 (KR) ........................... P2000-85394

(51) Int. Cl.⁷ ..................... H01L 21/302; H01L 21/461
(52) U.S. Cl. ..................... 438/738; 438/714; 438/725; 438/734
(58) Field of Search ............................... 438/714, 725, 438/734, 738

(56) References Cited

U.S. PATENT DOCUMENTS 5,227,012 A * 7/1993 Brandli et al. ............... 216/16
6,284,558 B1 * 9/2001 Sakamoto ..................... 438/30
6,366,331 B1 * 4/2002 Sakamoto et al. ........... 349/43
6,475,836 B1 * 11/2002 Suzawa et al. ............. 438/149

FOREIGN PATENT DOCUMENTS

| JP | 408017798 | * | 6/1996 | ....... H01L/21/3065 |
| JP | 110780 | * | 4/2001 | ....... H01L/21/3065 |

* cited by examiner

Primary Examiner—Eddie Lee
Assistant Examiner—Samuel A. Gebremariam
(74) Attorney, Agent, or Firm—McKenna Long & Aldridge LLP

(57) ABSTRACT

A method of fabricating an X-ray detecting device that is capable of preventing breakage of a transparent electrode. In the method, patterning of first and second insulating films occurs at different etching rates, with an etching ratio of the second insulating material to the first insulating material being greater than 1. Accordingly, undercut of the first and second insulating materials can be prevented. This stabilizes the step coverage of a subsequently formed transparent electrode.

13 Claims, 14 Drawing Sheets

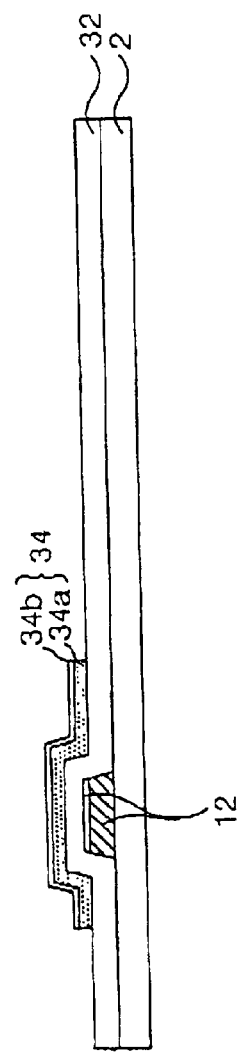
FIG.3A CONVENTIONAL ART
FIG.3B CONVENTIONAL ART

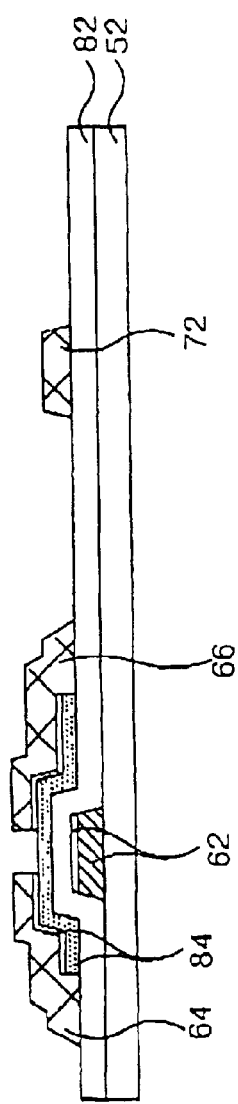
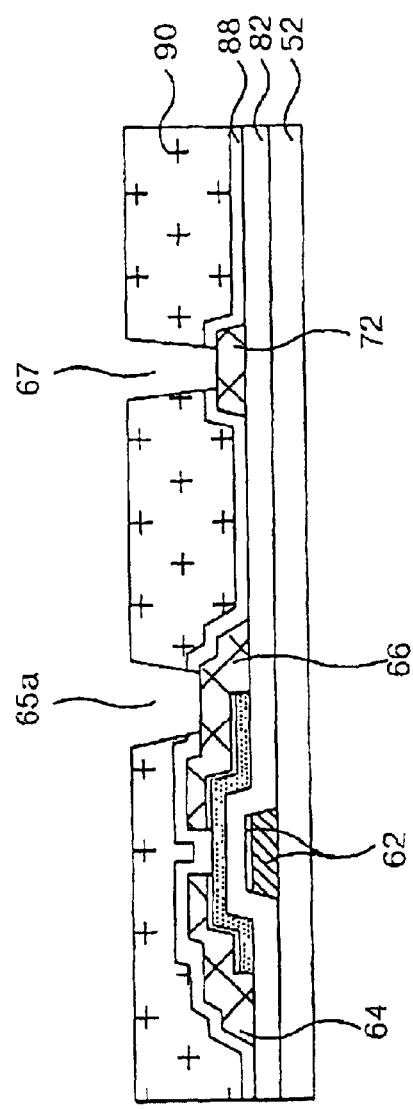

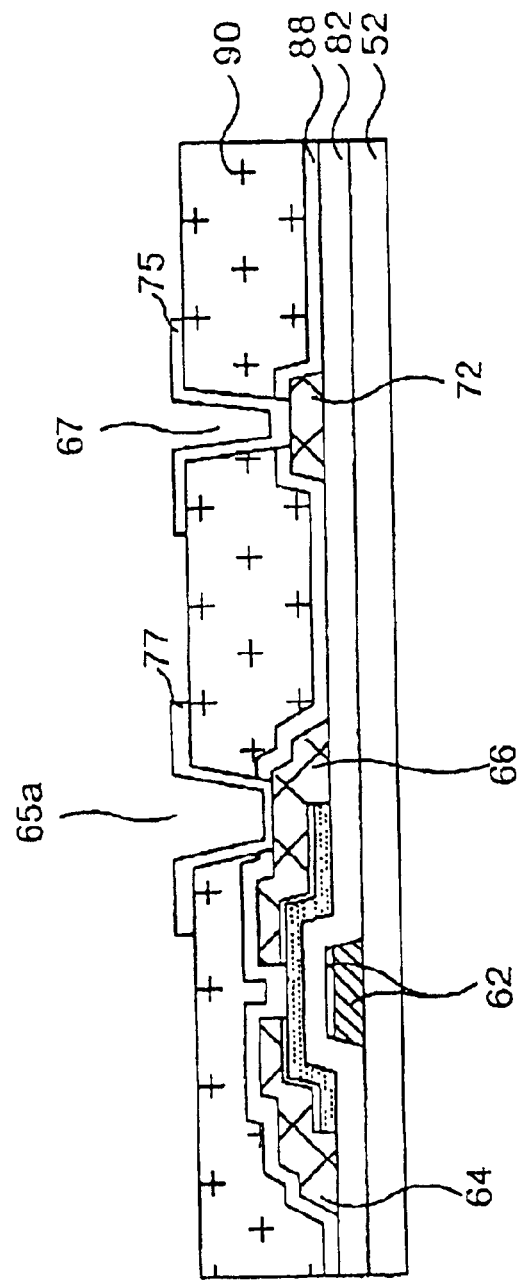

METHOD OF FABRICATING X-RAY DETECTING DEVICE

This application claims the benefit of Korean Patent Application No. P2000-85394 filed on Dec. 29, 2000, which is hereby incorporated by reference for all purposes as if fully set forth herein.

BACKGROUND OF THE INVENTION

1. Field of the Invention

This invention relates to X-ray detectors. More particularly, it relates to a method of fabricating an X-ray detecting device with reduced breakage of a transparent electrode.

2. Discussion of the Related Art

X-ray imaging systems typically produce photographs of objects using X-rays. Such systems have been successfully used for medical, scientific, and industrial applications. While photographic films are usually used, another type of X-ray imaging system uses X-ray detecting panels that convert X-rays into electrical signals. Such an X-ray detecting panel is illustrated in FIG. 1. As shown, that panel includes a photosensitive layer 6 for converting X-rays into electrical signals, and a thin film transistor substrate 4 that selectively outputs those electrical signals.

The thin film transistor substrate 4 includes pixel electrodes 5, which are arranged in pixel units, and thin film transistors (TFT's), each of which is connected to a charging capacitor Cst, to a gate line 3, and to a data line (which is not shown). On the upper portion of the photo sensitive layer 6 is a dielectric layer 7 and an upper electrode 8. The upper electrode 8 is connected to a high voltage generator 9.

The photosensitive layer 6 is usually comprised of selenium that is hundreds of microns thickness. That photosensitive layer detects incident X-rays and converts them into electrical signals. When doing this, the photosensitive layer 6 produces electron-hole pairs in response to the incident X-rays. The electron-hole pairs are separated by a high voltage (several kV) that is applied to the upper electrode 8 by the high voltage generator 9. Holes are stored in the charging capacitors Cst by way of the pixel electrodes 5. However, some holes accumulate on the surfaces of the pixel electrodes 5. This results in fewer holes being stored in the charging capacitor Cst. To prevent this, a charge-blocking layer 11 is formed on each pixel electrode 5. The thin film transistors (TFT) respond to gate signals input on the gate line 3 by applying pixel signals from the charging capacitor Cst to the data line. Those pixel signals are applied, via a data reproducer, to a display device that produces an image.

FIG. 2 is a plan view showing a structure of a conventional X-ray detecting device in a way that emphasizes a thin film transistor part and a storage capacitor part. As shown, a substrate 2 is provided with a gate electrode 12, a gate insulating film 32 over the substrate and over the gate electrode, and a semiconductor layer 34. Over the semiconductor layer 34 is a source electrode 14 and a drain electrode 16. In order to protect the thin film transistor, a storage insulating film 38, and first and second protective films 40 and 36 are formed over the thin film transistor. A first drain contact hole 15a passes through the storage insulating film 38, while a second drain contact hole 15b passes through the first and second protective films 40 and 36. The drain electrode 16 electrically contacts a drain transparent electrode 27 via the first drain contact hole 15a. Further, the drain transparent electrode 27 electrically contacts the pixel electrode 5 via the second contact hole 15b. Thus, the drain electrode 16 is in electrical contact with the pixel electrode 5 via the first and second contact holes 15a and 15b.

The charge capacitor part Cst consists of a storage electrode 25, the pixel electrode 5, which is positioned over the storage electrode 25, and the interposed second protective film 36. Below the storage electrode 25 is a ground line 22 for resetting residual charges on the charging capacitor Cst. The ground line 22 and the storage electrode 25 are in electrical contact via a storage contact hole 17 that passes through the storage insulating film 38 and the first protective film 40.

FIG. 3A to FIG. 3G are section views showing a method of fabricating the X-ray detecting device of FIG. 2. First, the gate electrode 12 is formed by sequentially depositing first and second gate metals 12a and 12b onto the substrate 2, and then patterning those metals as shown in FIG. 3A.

Referring now to FIG. 3B, the gate insulating film 32, an active layer 34a, and an ohmic contact layer 34b are then formed by depositing an insulating material, and first and second semiconductor materials over the substrate 2 (including over the gate electrode 12), and then patterning the first and second semiconductor materials to form a semiconductor layer 34.

After formation of the semiconductor layer 34, as shown in FIG. 3C, the source 14, the drain electrode 16, and the ground line 22 are formed by first depositing a data metal onto the gate insulating film 32 and then patterning the data metal.

Referring now to FIG. 3D, the storage insulating film 38 and the first protective film 40 are then formed by depositing first and second insulating materials over the substrate 2, including over the source electrode 14, the drain electrode 16 and the ground line 22. The first drain contact hole 15a and the storage contact hole 17 are then defined by patterning the storage insulating film 38 and the first protective film 40. FIG. 3D will be referred back again.

Then, as shown in FIG. 3E, a transparent drain electrode 27 and a storage electrode 25 that are, respectively, in contact with the drain electrode 16 and the ground line 22, are then formed by depositing a data metal on the first protective film 40 and then by patterning that data metal.

As shown in FIG. 3F, the second protective film 36 and the second drain contact hole 15b are then formed by depositing an insulating material on the first protective film 40, and then by patterning that insulating material to form the drain contact hole 15b.

Finally, as shown in FIG. 3G, the pixel electrode 5, which is electrically connected to the transparent drain electrode 27 via the second drain contact hole 15b, is formed by depositing a transparent conductive material onto the second protective film 36, and then by patterning that transparent conductive material.

Referring once again to FIG. 3D, the first drain contact hole 15a and the storage contact hole 17 are typically formed by simultaneously patterning the storage insulating film 38 and the first protective film 40 using dry etching. The storage insulating film 38 and the first protective film 40 are formed from an inorganic insulating material and from an organic material that generally have different etching rates. The etching rate of the storage insulating film 38 is usually faster than that of the first protective film 40, resulting in over-etching of the storage insulating film 38 in comparison with the first protective film 40. This causes an undercut phenomenon, shown in the expanded view of FIG. 3D, that results in the transparent conductive material deposited on the first protective film 40 (reference FIG. 3F) having poor coverage, thereby creating breakage problems at the transparent drain electrode 27 and the storage electrode 25.

SUMMARY OF THE INVENTION

Accordingly, the present invention is directed to a method of fabricating x-ray detecting devices that substantially obviates one or more of the problems due to limitations and disadvantages of the related art.

An advantage of the present invention is a method of fabricating an X-ray detecting device with reduced breakage of a transparent electrode.

In order to achieve the objects of the invention, a method of fabricating an X-ray detecting device according to an embodiment of the present invention includes the steps of providing a thin film transistor and a lower electrode of a storage capacitor on a substrate; providing an inorganic insulating film in such a manner as to cover the thin film transistor and the storage capacitor lower electrode; providing an organic insulating film on the inorganic insulating film; and selecting a mixed ratio of a gas injected during dry etching such that the etching ratio of the organic insulating film to the inorganic insulating film is more than 1, thereby etching the organic insulating film faster than the inorganic insulating film.

In the method, the etching rate of the organic insulating film is greater than that of the inorganic insulating film.

Beneficially, the injected gas contains $SF_6$, $O_2$, $O_2+Cl_2$ and $CF_4$. Also beneficially, the component ratio of $SF_6$ to $O_2$ is 1:3.

The method further includes the steps of patterning the inorganic insulating film and the organic insulating film to provide a storage insulating film and a first protective film; forming a transparent electrode on the first protective film; forming a second protective film on the first protective film; and providing a pixel electrode on the second protective film.

The step of providing the thin film transistor includes forming a gate electrode on the substrate; forming a gate insulating film on the substrate; forming a semiconductor layer on the gate insulating film; and forming source and drain electrodes on the semiconductor layer and on the gate insulating film such that a channel is formed.

The inorganic insulating film is beneficially made from any one of silicon nitride (SiNx) and silicon oxide (SiOx).

The organic insulating film is beneficially made from any one of an acrylic organic compound, Teflon, BCB (benzocyclobutene), Cytop and PFCB (perfluorocyclobutane).

Additional features and advantages of the present invention will be set forth in the description that follows, and in part will be apparent from that description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 3A to FIG. 3G are section views showing a method of fabricating the X-ray detecting device of FIG. 2;

FIG. 4A to FIG. 4G are section views showing a method of fabricating an X-ray detecting device according to an embodiment of the present invention.

DETAILED DESCRIPTION OF THE ILLUSTRATED EMBODIMENTS

Reference will now be made in detail to an embodiment of the present invention, an example of which is illustrated in the accompanying drawings.

Figure 1:
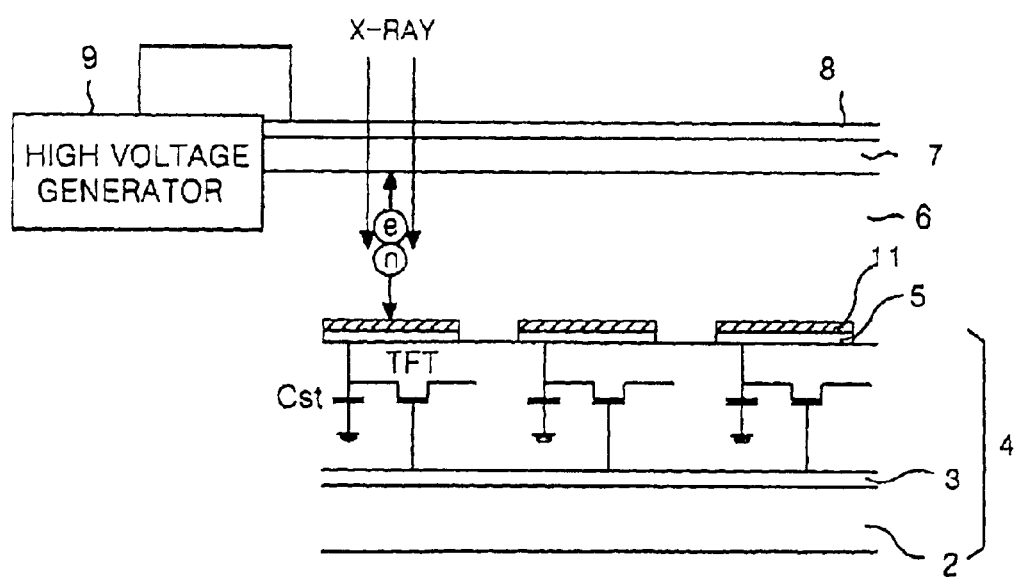
FIG. 1 is a schematic block circuit view showing a panel structure of a conventional X-ray detecting device.
Figure 2:
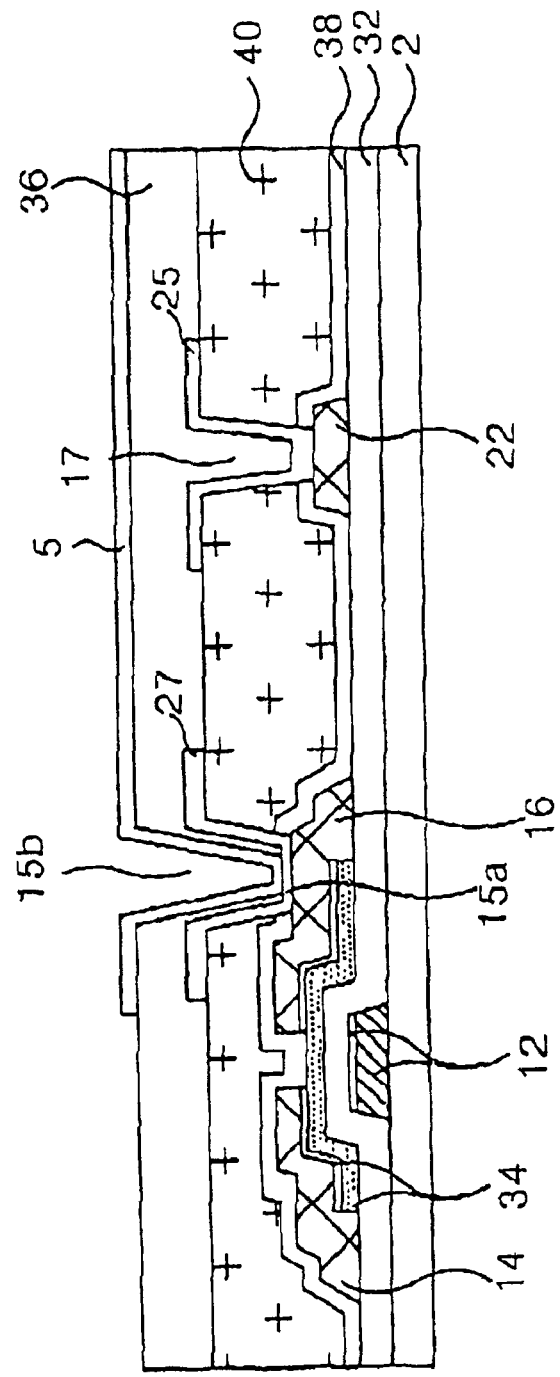
FIG. 2 is a section view of an X-ray detecting device according to FIG. 1.
Figure 3C:
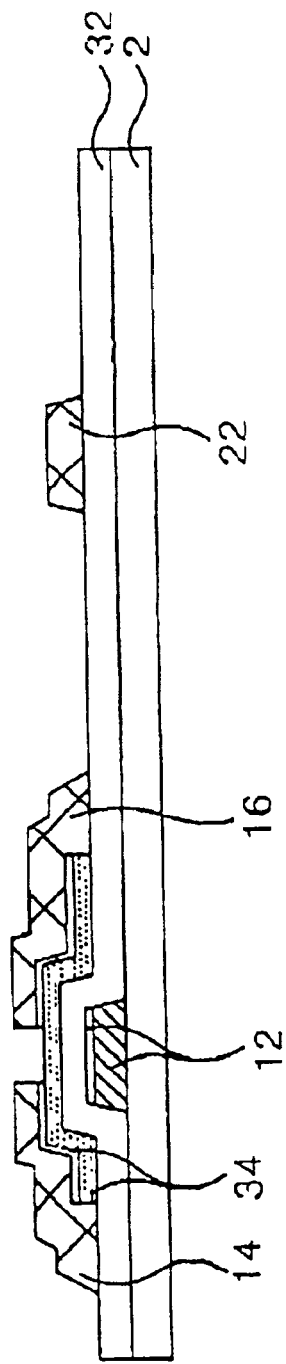
Figure 3D:
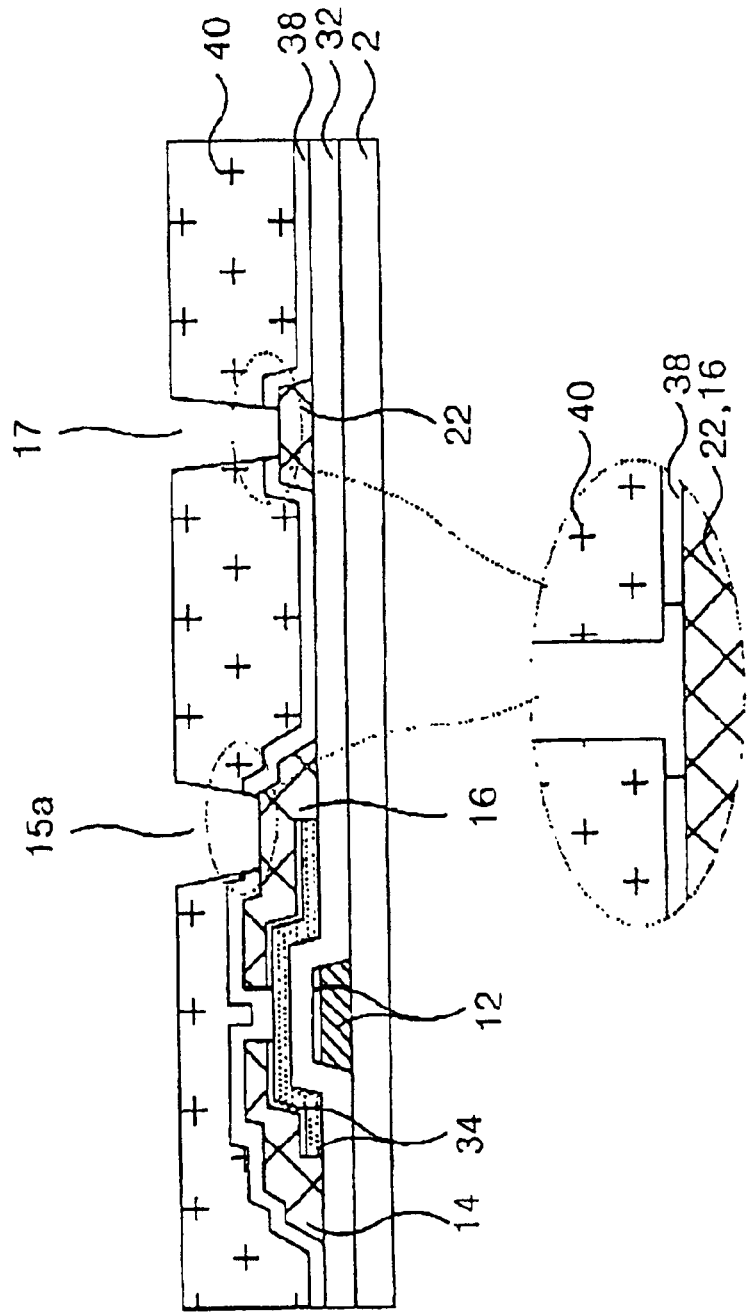
Figure 3E:
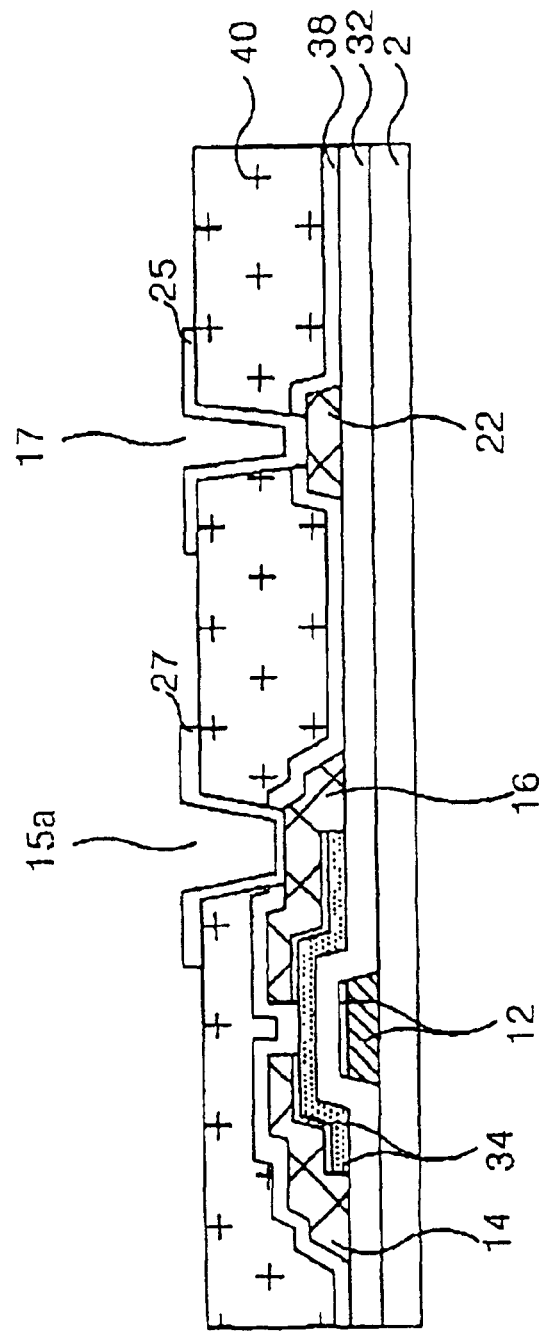
Figure 3F:
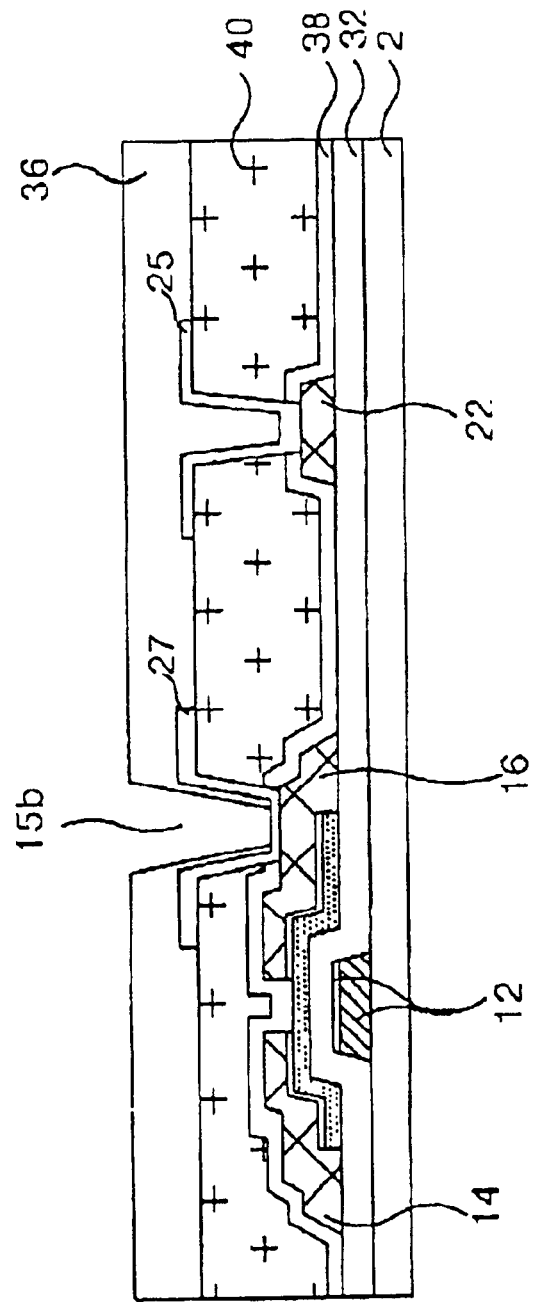
Figure 3G:
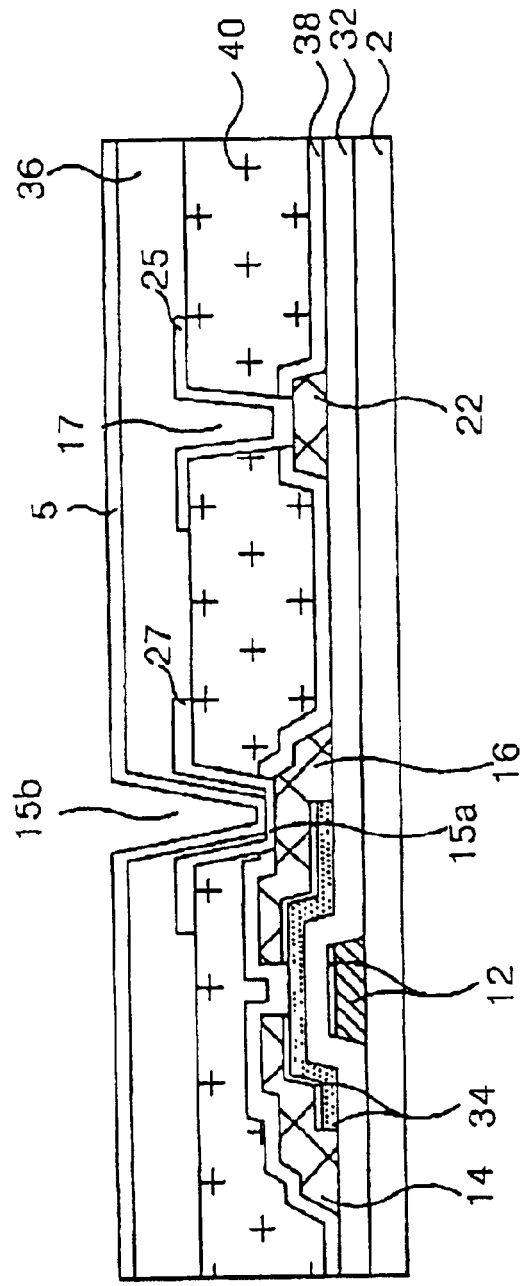
Figure 4A:

FIG. 4A to FIG. 4G are section views showing a method of fabricating an X-ray detecting device according to an embodiment of the present invention, with emphasis on a thin film transistor part and on a storage capacitor part. Referring first to FIG. 4A, a gate electrode 62 is provided on a substrate 52. The gate electrode 62 is beneficially formed by sequentially depositing first and second gate metal materials 62a and 62b using a deposition technique (such as sputtering), and then patterning those materials. The first metal material 62a is formed from aluminum (Al) or from an aluminum alloy, while the second metal material 62b is formed from molybdenum (Mo) or chrome (Cr).

Figure 4B:
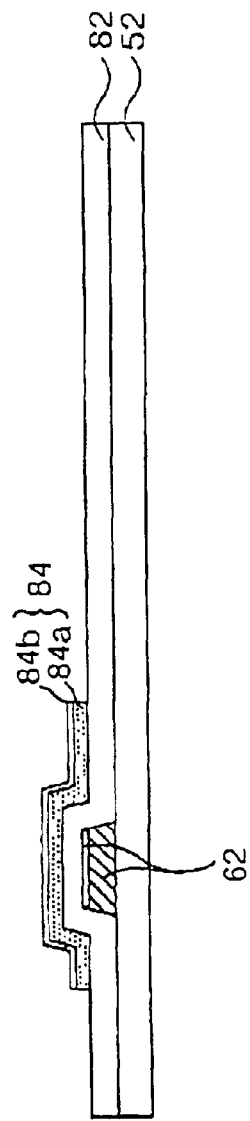

Referring now to FIG. 4B, a semiconductor layer 84 is provided on a gate insulating film 82. The gate insulating film 82 is formed by depositing an insulating material on the substrate 52 (such as by plasma enhanced chemical vapor deposition (PECVD)) so as to cover the gate electrode 62. An active layer 84a and an ohmic contact layer 84b are then formed by depositing and patterning first and second semiconductor materials on the gate insulating film 82. The gate insulating film 82 is beneficially made from an insulating material such as silicon nitride (SiNx) or silicon oxide (SiOx). The active layer 84a is made from intrinsic amorphous silicon, while the ohmic contact layer 84b is made from doped amorphous silicon.

Referring now to FIG. 4C, a source electrode 64, a drain electrode 66, and a ground line 72 are provided on the gate insulating film 82. The ground line 72, the source electrode 64, and the drain electrode 66 are formed by depositing a data metal layer (using CVD or sputtering) and then patterning that data metal layer. After the source and drain electrodes 66 and 64 are patterned, the ohmic contact layer 84b (see FIG. 4B) over the gate electrode 62 is patterned to expose the active layer 84a (see FIG. 4B). The active layer 84a between the source and drain electrodes 66 and 64 acts as a channel. The ground line 72 and the source and drain electrodes 64 and 66 are beneficially of a metal such as chrome (Cr) or molybdenum (Mo).

Referring now to FIG. 4D, a storage insulating film 88 and a first protective film 90 are then provided over the gate insulating film 82. The storage insulating film 88 is formed by depositing a first insulating material on the gate insulating film 82 such that the source electrode 64, the drain electrode 66 and the ground line 72 are covered. Then, the first protective film 90 is formed over the storage insulating film 88 by depositing a second insulating material over the storage insulating film 88. A first drain contact hole 65a and a first storage contact hole 67, both of which pass through the storage insulating film 88 and the first protective film 90, are then etched so as to expose portions of the surfaces of the drain electrode 66 and the ground line 72.

As both the storage insulating film 88 and the first protective film 90 are etched, according to the principles of the present invention the etching ratio between the first insulating material (for the storage insulating film 88) and the second insulating material (for the first protective film 90) is greater than 1. In order to obtain such an etching ratio the etching rate of the second insulating material should be faster than that of the first insulating material. Accordingly, undercutting of the storage insulating film 88 is prevented The storage insulating film 88 is made from an inorganic insulating material, such as silicon nitride (SiNx) or silicon oxide (SiOx). On the other hand, the first protective film 90 is made from an organic insulating material, such as an acrylic organic compound, Teflon, BCB (benzocyclobutene), Cytop or PFCB (perfluorocyclobutane).

Figure 4F:
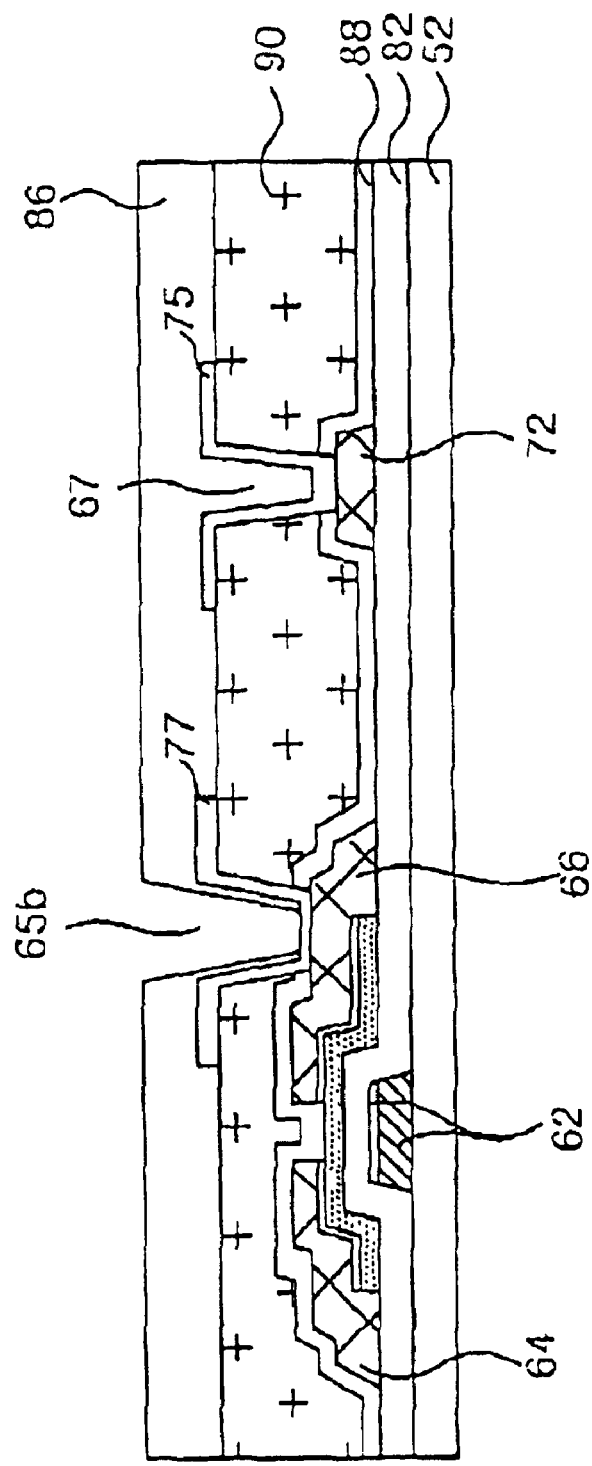

Referring now to FIG. 4F, a transparent drain electrode 77 and a storage electrode 75 are provided on the first protective film 90. The transparent drain electrode 77 and the storage electrode 75 are formed by depositing and patterning a conductive transparent material onto the first protective film 90. The transparent drain electrode 77 is electrically connected to the drain electrode 66 via a first drain contact hole 65a while the storage electrode 75 is electrically connected to the ground line 72 via a storage contact hole 67 (reference FIG. 4E).

The transparent drain electrode 77 and the storage electrode 75 are made from any one of indium-tin-oxide (ITO), indium-zinc-oxide (IZO) and indium-tin-zinc-oxide (ITZO).

Figure 4G:
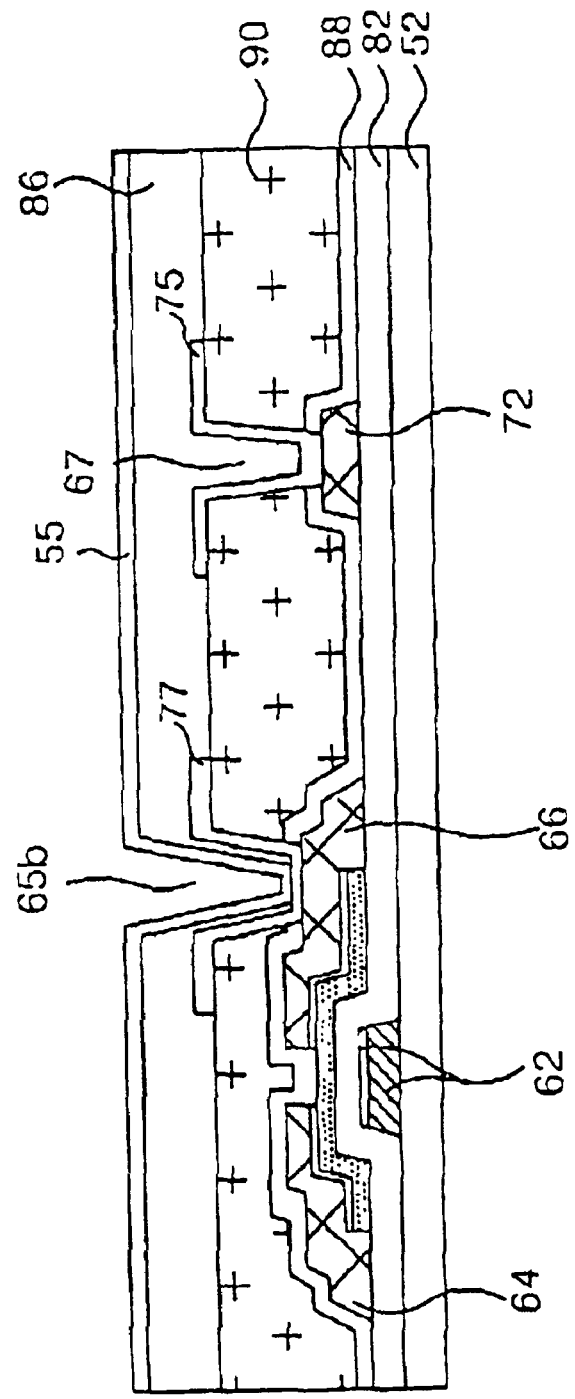

Referring to FIG. 4G, a second protective film 86 is provided on the first protective film 90. The second protective film 86 is formed by depositing an insulating material on the first protective film 90 so as to cover the transparent drain electrode 77 and the storage electrode 75. Then, the second protective film 86 is patterned to form a second drain contact hole 65b that exposes a portion of the transparent drain electrode 77. The second protective film 86 is beneficially an inorganic insulating material such as silicon nitride (SiNx) or silicon oxide (SiOx).

Still referring to FIG. 4G, a pixel electrode 55 is then provided on the second protective layer 86. The pixel electrode 55 is formed by depositing a transparent conductive material, such as ITO, IZO or ITZO, onto the second protective layer 86. The pixel electrode 55 is formed in electrical contact with the drain electrode 66 via the first and second drain contact holes 65a and 65b.

Figure 5:
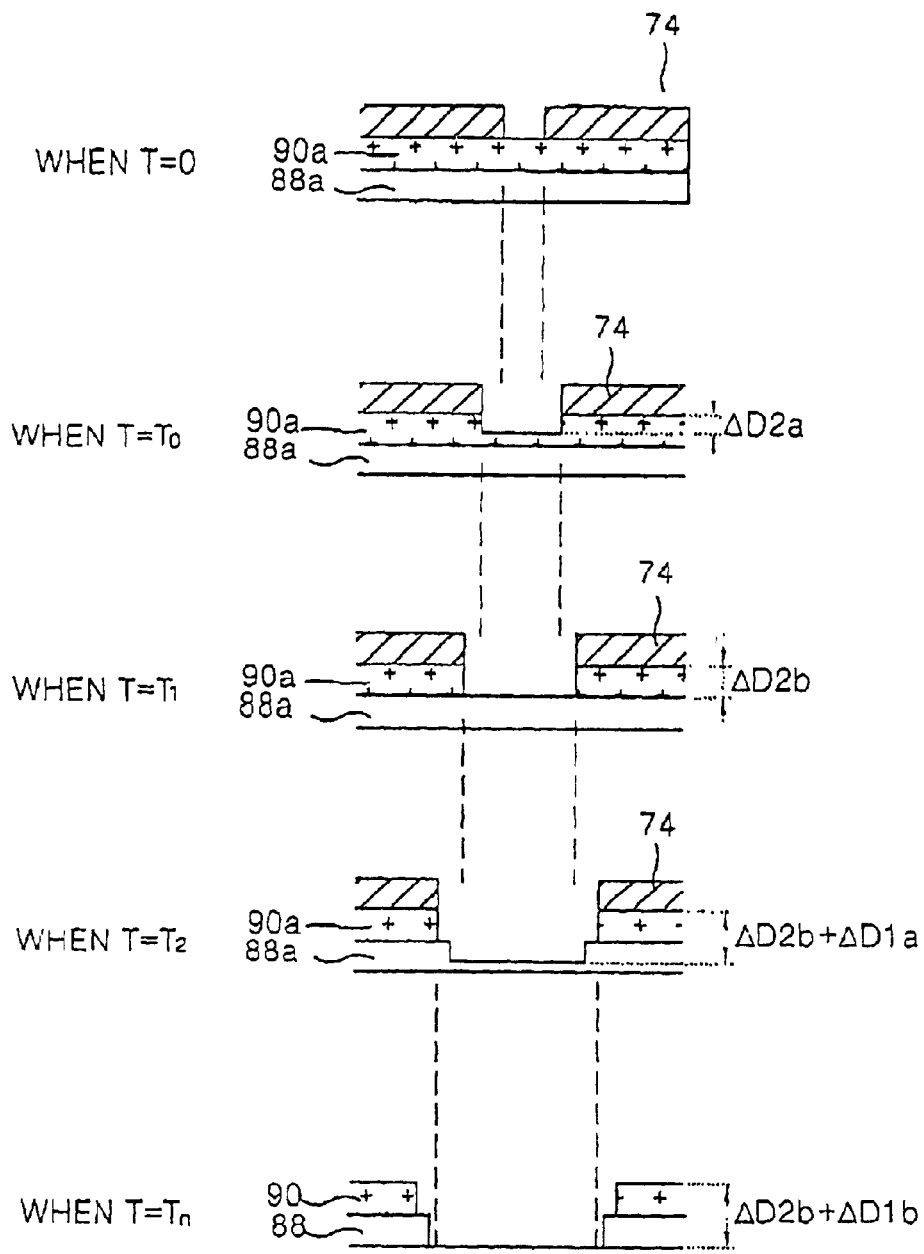
FIG. 5 is section views representing an etching process of the storage insulating film and the first protective film according to the present invention.

FIG. 5 illustrates etching a first insulating material 88a and a second insulation material 90a. Generally, the etching process includes an isotropic etch in which the etching rates in the horizontal and vertical directions per unit time are equal, and an anisotropic etch in which the etching rate in the horizontal and vertical directions differ. The etching rate is the thickness etched per unit time. The ratio of one etch to another is called an etching ratio. An etching relationship is:

$$D = \Delta D / \Delta t \quad (1)$$

$$R = D2/D1 \quad (2)$$

where D, D1 and D2 represent etching rates; $\Delta t$ represents a unit time change; $\Delta D$ represents a change in thickness; and R represents an etching ratio.

Still referring to FIG. 5, assuming that the etching rate of the first insulating material 88a is D1, and the etching rate of the second insulating material 90a is D2, an etching process wherein the etching rate D1 is less than the etching rate D2 will be described. First, at time T=0, the first insulating material 88a, the second insulating material 90a, and a photo resist pattern 74 are provided on a substrate, which is placed in an etching chamber (which is not shown). A gas containing $SF_6$, $O_2$, $O_2+Cl_2$ and $CF_4$ is injected into the chamber so as to cause a plasma discharge. At that time, the component ratio of $SF_6$ to $O_2$ is greater than 1:3. An etching reaction between the injection gas and the first and second insulating materials 88a and 90a begins at $T=T_0$.

The second insulating material 90a is etched a distance $\Delta D2a$ in the vertical and horizontal directions. At $T=T_1$, the second insulating material 90a is etched a distance $\Delta D2b$. Then, at $T=T_2$, the first and second insulating materials 88a and 90a are etched distances $\Delta D2b+\Delta D1a$ in the vertical and horizontal directions. At $T=T_n$, the first and second insulating materials 88a and 90a are patterned by $\Delta D2b+\Delta D1b$ in the vertical and horizontal directions so as to provide the storage insulating film 88 and the first protective film 90, without undercut. Subsequently, the photo resist pattern 74 on the first protective film 90 is removed. Accordingly, the step coverage of the transparent conductive material deposited over the first protective film 90 is stabilized to prevent breakage of the storage electrode 75 and of the transparent drain electrode 77.

As described above, according to the present invention, upon patterning of the first and second insulating films having different etching rates, an etching ratio of the second insulating material to the first insulating material is greater than 1. Thus, undercut between the first and second insulating materials can be prevented. Accordingly, the step coverage of the transparent electrode provided on the second insulating material can be stabilized to prevent breakage of a transparent electrode.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating an X-ray detecting device, comprising the steps of:

providing a thin film transistor and a lower electrode of a storage capacitor on a substrate;

providing an inorganic insulating film over the thin film transistor and over the lower electrode;

providing an organic insulating film over the inorganic insulating film; and simultaneously dry etching the organic insulating film and the inorganic insulating film using a mixed ratio gas that etches the organic insulating film faster than the inorganic insulating film, wherein the mixed ratio gas contains $SF_6$, $O_2$, $O_2+Cl_2$, and $CF_4$.

2. The method according to claim 1, wherein an etching rate of the organic insulating film is greater than that of the inorganic insulating film.

3. The method according to claim 1, wherein a component ratio of $SF_6$ to $O_2$ is about 1:3.

4. The method according to claim 1, further comprising the steps of:

patterning the inorganic insulating film and the organic insulating film to provide a storage insulating film and a first protective film;

forming a transparent electrode on the first protective film;

forming a second protective film on the first protective film; and providing a pixel electrode on the second protective film.

5. The method according to claim 1, wherein said step of providing the thin film transistor includes:

forming a gate electrode on the substrate;

forming a gate insulating film over the substrate and over the gate electrode;

forming a semiconductor layer on the gate insulating film; and forming source and drain electrodes on the semiconductor layer.

6. The method according to claim 1, wherein the inorganic insulating film is made from any one of silicon nitride (SiNx) and silicon oxide (SiOx).

7. The method according to claim 1, wherein the organic insulating film is made from any one of an acrylic organic compound, Teflon, BCB (benzocyclobutene), Cytop and PFCB (perfluorocyclobutane).

8. A method of fabricating a semiconductor assembly, comprising the steps of:

providing a thin film transistor and a lower electrode of a storage capacitor on a substrate;

providing a first insulating film over the thin film transistor and over the lower electrode;

providing a second insulating film over the first insulating film; and simultaneously dry etching the first insulating film and the second insulating film using a mixed ratio gas that etches the second insulating film faster than the first insulating film, wherein the mixed ratio gas contains $SF_6$, $O_2$, $O_2+Cl_2$ and $CF_4$.

9. The method according to claim 8, wherein a component ratio of $SF_6$ to $O_2$ is about 1:3.

10. The method according to claim 8, further comprising the steps of:

patterning the first insulating film and the second insulating film to provide a storage insulating film and a first protective film;

forming a transparent electrode on the first protective film;

forming a second protective film on the first protective film; and providing a pixel electrode on the second protective film.

11. The method according to claim 1, wherein said step of providing the thin film transistor includes:

forming a gate electrode on the substrate;

forming a gate insulating film over the substrate and over the gate electrode;

forming a semiconductor layer on the gate insulating film; and forming source and drain electrodes on the semiconductor layer.

12. The method according to claim 8, wherein the first insulating film is made from any one of silicon nitride (SiNx) and silicon oxide (SiOx).

13. The method according to claim 8, wherein the second insulating film is made from any one of an acrylic organic compound, Teflon, BCB (benzocyclobutene), Cytop and PFCB (perfluorocyclobutane).

* * * * *